US011784280B2

(12) United States Patent
Dion et al.

(10) Patent No.: US 11,784,280 B2
(45) Date of Patent: Oct. 10, 2023

(54) OPTOELECTRONIC DEVICE WITH REDUCED OPTICAL LOSS

(71) Applicant: Sensor Electronic Technology, Inc., Columbia, SC (US)

(72) Inventors: Joseph Dion, Columbia, SC (US); Devendra Diwan, Columbia, SC (US); Brandon A Robinson, Columbia, SC (US); Rakesh B Jain, Elgin, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 71 days.

(21) Appl. No.: 17/206,398

(22) Filed: Mar. 19, 2021

(65) Prior Publication Data
US 2021/0296525 A1 Sep. 23, 2021

Related U.S. Application Data

(60) Provisional application No. 62/992,216, filed on Mar. 20, 2020.

(51) Int. Cl.
| H01L 33/00 | (2010.01) |
| H01L 33/32 | (2010.01) |
| H01L 33/10 | (2010.01) |
| H01L 33/06 | (2010.01) |
| H01L 33/04 | (2010.01) |
| H01L 33/14 | (2010.01) |

(52) U.S. Cl.
CPC .......... *H01L 33/0025* (2013.01); *H01L 33/04* (2013.01); *H01L 33/06* (2013.01); *H01L 33/10* (2013.01); *H01L 33/14* (2013.01); *H01L 33/32* (2013.01)

(58) Field of Classification Search
CPC ..... H01L 33/0025; H01L 33/06; H01L 33/10; H01L 33/32
See application file for complete search history.

(56) References Cited

U.S. PATENT DOCUMENTS

| 8,330,168 B2 * | 12/2012 | Ohta ................. H01L 33/32 257/E29.091 |
| 9,660,133 B2 | 5/2017 | Jain et al. |
| 10,193,016 B2 * | 1/2019 | Fujita ................. H01L 33/06 |
| 10,535,793 B2 | 1/2020 | Jain et al. |

(Continued)

FOREIGN PATENT DOCUMENTS

| KR | 1020120081335 A | 7/2012 |
| KR | 1020170137393 A | 12/2017 |

OTHER PUBLICATIONS

International Application No. PCT/US2021/023194, International Search Report and Written Opinion, dated Jul. 12, 2021, 11 pages.

*Primary Examiner* — Mark W Tornow
(74) *Attorney, Agent, or Firm* — LaBatt, LLC (57) ABSTRACT

A heterostructure with reduced optical losses is disclosed. The heterostructure includes a set of n-type layers; an active region that generates radiation at a peak emitted wavelength; and a set of p-type layers located adjacent to the active region. A reflective structure can be located adjacent to the set of p-type layers. A thickness of the set of p-type layers can be configured to promote constructive interference of the reflected radiation with radiation emitted by the active region in a direction toward the set of n-type layers.

20 Claims, 4 Drawing Sheets

(56) References Cited

U.S. PATENT DOCUMENTS

| | | |
|---|---|---|
| 2008/0029773 A1 | 2/2008 | Jorgenson |
| 2015/0083994 A1* | 3/2015 | Jain .................... H01L 33/0075 |
| | | 438/37 |
| 2017/0256672 A1 | 9/2017 | Jain et al. |
| 2019/0019918 A1 | 1/2019 | Vaufrey |
| 2019/0326473 A1 | 10/2019 | Choi et al. |

* cited by examiner

FIG. 4

OPTOELECTRONIC DEVICE WITH REDUCED OPTICAL LOSS

REFERENCE TO RELATED APPLICATIONS

The current application claims the benefit of U.S. Provisional Application No. 62/992,216, filed on 20 Mar. 2020, which is hereby incorporated by reference.

TECHNICAL FIELD

The disclosure relates generally to optoelectronic devices, and more particularly, to group III nitride heterostructures for use in fabricating optoelectronic devices.

BACKGROUND ART

Semiconductor light emitting devices, such as light emitting diodes (LEDs) and laser diodes (LDs), generally include solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride-based LEDs and LDs can be of the form $In_yAl_xGa_{1-x-y}N$, where x and y indicate the molar fraction of a given element, $0 \leq x$, $y \leq 1$, and $0 \leq x+y \leq 1$. Other illustrative group III nitride-based LEDs and LDs are based on boron nitride (BN) and can be of the form $Ga_zIn_yAl_xB_{1-x-y-z}N$, where $0 \leq x$, $y$, $z \leq 1$, and $0 \leq x+y+z \leq 1$.

An LED is typically composed of semiconducting layers. During operation of the LED, an applied bias across doped layers leads to injection of electrons and holes into an active region where electron-hole recombination leads to light generation. Light is generated with uniform angular distribution and escapes the LED die by traversing semiconductor layers in all directions. Each semiconducting layer has a particular combination of molar fractions (e.g., x, y, and z) for the various elements, which influences the optical properties of the layer. In particular, the refractive index and absorption characteristics of a layer are sensitive to the molar fractions of the semiconductor alloy.

SUMMARY OF THE INVENTION

Aspects of the invention provide heterostructures for use in optoelectronic devices and the resulting optoelectronic devices. One or more parameters of the heterostructure can be configured to improve the reliability and/or increase the output of the corresponding optoelectronic device. The materials used to create the active structure of the device can be considered in configuring various parameters of the n-type and/or p-type sides of the heterostructure.

A first aspect of the invention provides a heterostructure comprising: an active region that generates radiation at a peak emitted wavelength; a set of p-type layers located adjacent to the active region; and a reflective p-type contact located adjacent to the set of p-type layers, wherein a thickness of the set of p-type layers is configured to ensure constructive interference with radiation emitted from the active region in a direction towards the n-type layer. In an embodiment, the active region can be formed from a series of alternating quantum wells and barriers. In an embodiment, the set of p-type layers can comprise a p-type layer stack comprising: an electron blocking layer; a p-type interlayer located adjacent to the electron blocking layer; and a p-type contact layer located adjacent to the p-type interlayer. In an embodiment, the reflective p-type contact comprises a metal stack. In an embodiment, the thickness of the set of p-type layers is a multiple of the peak emitted wavelength divided by two times an effective refractive index of the set of p-type layers.

A second aspect of the invention provides a heterostructure comprising: a set of n-type layers; an active region located adjacent to the set of n-type layers, the active region including a plurality of quantum wells alternating with a plurality of barriers, wherein the active region is configured to generate radiation at a peak emitted wavelength; a set of p-type layers located adjacent to the active region, wherein the set of p-type layers comprises: an electron blocking layer; a p-type interlayer located adjacent to the electron blocking layer; and a p-type contact layer located adjacent to the p-type interlayer; and a reflective structure located adjacent to the set of p-type layers, wherein a thickness of the set of p-type layers is configured to promote constructive interference between light reflected from the reflective structure and light emitted from a topmost quantum well of the active region in a direction toward the set of n-type layers.

A third aspect of the invention provides an optoelectronic device comprising: a heterostructure including: a first set of semiconductor layers; an active region located adjacent to the first set of semiconductor layers, the active region including a plurality of quantum wells alternating with a plurality of barriers, wherein the active region is configured to generate radiation at a peak emitted wavelength; a second set of semiconductor layers located adjacent to the active; and a reflective structure located adjacent to the second set of semiconductor layers, wherein a thickness of the second set of semiconductor layers is configured to promote constructive interference between light reflected from the reflective structure and light emitted from at least one of the plurality of quantum wells of the active region in a direction toward the first set of semiconductor layers.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide heterostructures for use in optoelectronic devices and the resulting optoelectronic devices. An illustrative embodiment can reduce absorption losses in a heterostructure without any increase in the operating voltage. The heterostructure can include a p-type later stack having one or more attributes that are configured to reduce optical losses related to internal reflection and interference. While described in conjunction with the p-type side of the device, it is understood that the teachings can be applied equally to an n-type side of the device, e.g., when the device is configured to emit light through the p-type side.

The heterostructure includes an active region that generates radiation at a peak emitted wavelength; a set of p-type layers located adjacent to the active region; and a reflective structure located adjacent to the set of p-type layers. A thickness of the set of p-type layers is configured to promote constructive interference of the reflected radiation with radiation emitted by the active region in a direction toward the n-type layer. In an embodiment, a thickness of the set of p-type layers (e.g., the p-type layer stack) is a multiple of the emitted wavelength divided by two times an effective refractive index of the p-type layer stack. In an embodiment, the active region can be formed from a series of alternating quantum wells and barriers. In an embodiment, the set of p-type layers can comprise a p-type layer stack comprising: an electron blocking layer; a p-type interlayer located adjacent to the electron blocking layer; and a p-type contact layer located adjacent to the p-type interlayer. In an embodiment, the reflective structure is a p-type contact comprising a metal stack.

A semiconductor layer of any of the semiconductor heterostructures described herein can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by a active region (e.g., peak emission wavelength+/−five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A semiconductor layer of any semiconductor heterostructures described herein can be considered to be reflective when the layer reflects at least a portion of the relevant electromagnetic radiation (e.g., light having wavelengths close to the peak emission of the active region). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The semiconductor heterostructures described herein can be used to form one of a variety of optoelectronic devices. Examples of possible optoelectronic devices include, but are not limited to, light emitting devices, light emitting diodes (LEDs), including conventional and super luminescent LEDs, light emitting solid state lasers, laser diodes (LDs), photodetectors, photodiodes, ultraviolet LEDs, and ultraviolet LDs.

These examples of optoelectronic devices can be configured to emit or sense electromagnetic radiation in an active region upon application of a bias. The electromagnetic radiation emitted or sensed by these optoelectronic devices can comprise a peak wavelength within any range of wavelengths, including visible light, ultraviolet radiation, deep ultraviolet radiation, infrared light, and/or the like. For example, these optoelectronic devices can emit or sense radiation having a dominant wavelength within the ultraviolet range of wavelengths. As an illustration, the dominant wavelength can be within a range of wavelengths of approximately 210 nanometers (nm) to approximately 350 nm.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof. Additionally, as used herein, "vertical" is used to reference the growth direction of the corresponding structure, while "lateral" is used to reference a direction that is perpendicular to the growth direction. Additionally, spatially relative terms, such as "on," "below," "above," etc., are used in reference to the orientation shown in the drawings. It is understood that embodiments of the invention are not limited to any particular orientation of a device described herein.

The description may also list values of parameters of elements, components, materials, layers, structures, and the like, for the purpose of describing further details of particular embodiments. It is understood that, unless otherwise specified, each value is approximate and each range of values included herein is inclusive of the end values defining the range. As used herein, unless otherwise noted, the term "approximately" is inclusive of values within +/−ten percent of the stated value, while the term "substantially" is inclusive of values within +/−five percent of the stated value. Unless otherwise stated, two values are "similar" when the smaller value is within +/−twenty-five percent of the larger value. A value, y, is on the order of a stated value, x, when the value y satisfies the formula $0.1x \leq y \leq 10x$.

As used herein, two materials can have comparable compositions when the molar fractions of the corresponding materials differ by at most ten percent (five percent in a more specific embodiment). For example, consider two group III nitride materials, $Al_xIn_yB_zGa_{1-x-y-z}N$ and $Al_{x'}In_{y'}B_{z'}Ga_{1-x'-y'-z'}N$. The two materials have comparable compositions when each of the molar fractions x, y, and z differs from the corresponding molar fractions x', y', and z' by less than ten percent, where the percentage is calculated by taking a difference between the molar fractions and dividing the value by the higher molar fraction. Similarly, two layers have comparable thicknesses when the corresponding thicknesses differ by at most ten percent (five percent in a more specific embodiment). Unless otherwise specified, two layers have similar thicknesses when the respective thicknesses are within one nanometer (inclusive) of each other. Similarly, two layers have different thicknesses when the thicknesses differ by more than one nanometer. It is understood that two numbers are on the same order as one another when a ratio of the higher number to the lower number is less than ten.

Compositions of two semiconductor layers also can be evaluated in conjunction with the corresponding band gaps. In this case, as used herein, compositions of two semiconductor layers are the same when the band gaps of the two semiconductor layers differ by less than the thermal energy unit, kT. The compositions of two semiconductor layers are substantially the same when the band gaps of the two semiconductor layers differ by less than three times the thermal energy unit, 3kT. A composition of a first semiconductor layer is considered larger than a composition of a second semiconductor layer when the band gap of the first semiconductor layer is larger than the band gap of the second semiconductor layer by more than the thermal energy unit, kT. A composition of a first semiconductor layer is considered substantially larger than a composition of a second semiconductor layer when the band gap of the first semiconductor layer is larger than the band gap of the second semiconductor layer by more than three times the thermal energy unit, 3kT. Unless otherwise specified, the thermal energy unit is approximated as 0.026 eV.

Figure 1:
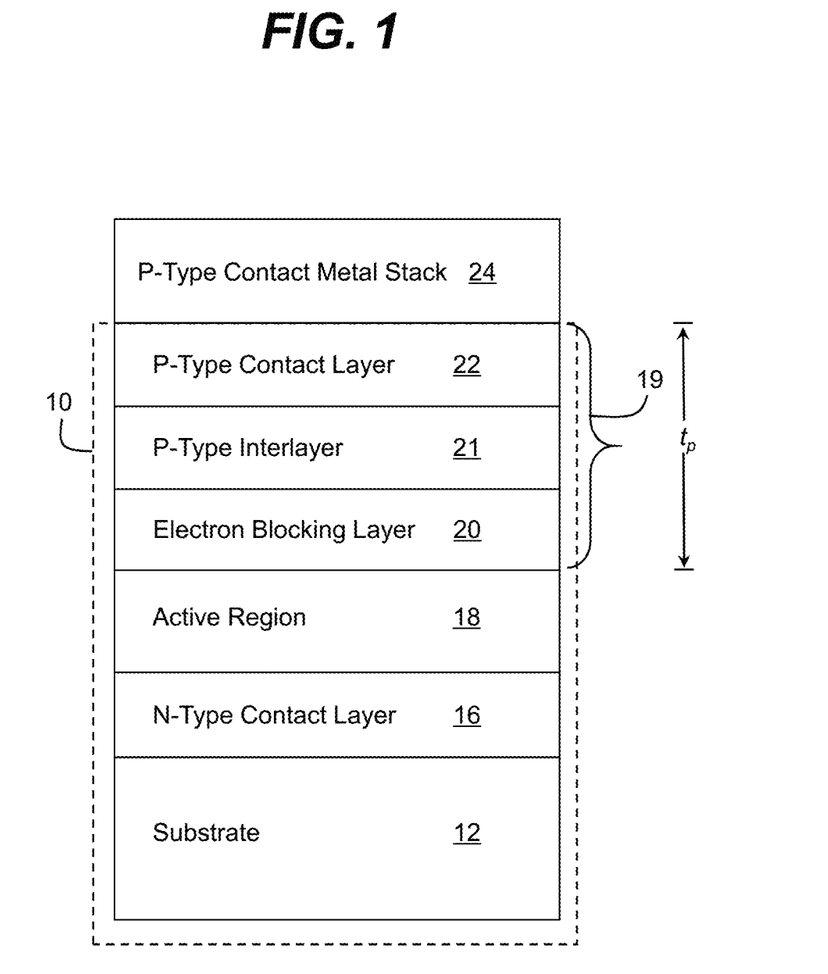
FIG. 1 shows a schematic structure of a heterostructure according to an embodiment.

Turning to the drawings, FIG. 1 shows an illustrative heterostructure 10 according to an embodiment. The heterostructure 10 can be configured for light emission and/or light sensing. To this extent, the heterostructure 10 can be used in fabricating an optoelectronic device, such as a conventional or super luminescent light emitting diode (LED), a light emitting laser, a laser diode, a light sensor, an ultraviolet sensor, a photodetector, a photodiode, and/or the like. In an illustrative embodiment, the optoelectronic device is configured to operate as an emitting device, such as a light emitting diode (LED). In this case, during operation of the optoelectronic device, application of a bias comparable to the band gap results in the emission of electromagnetic radiation from an active region 18 of the heterostructure 10. The electromagnetic radiation emitted by the heterostructure 10 can have a peak wavelength within any range of wavelengths, including visible light, ultraviolet radiation, deep ultraviolet radiation, infrared light, and/or the like. In an embodiment, the heterostructure 10 is configured to emit radiation having a dominant wavelength within the ultraviolet range of wavelengths. In a more specific embodiment, the dominant wavelength is within a range of wavelengths between approximately 210 and approximately 350 nanometers.

The heterostructure 10 is shown including an n-type side of the active region 18, which includes a substrate 12 and a n-type contact layer 16, and a p-type side of the active region 18, which includes a p-type layer stack 19, that includes an electron blocking layer 20, a p-type interlayer 21, and a p-type contact layer 22, and a p-type contact metal stack 24. In an embodiment, each subsequent structure/layer is epitaxially grown on a previous structure/layer using any solution. The substrate 12 can be sapphire, silicon carbide (SiC), silicon (Si), AlN, GaN, AlGaN, AlON, LiGaO$_2$, or another suitable material.

In an illustrative embodiment, the heterostructure 10 is a group III-V materials based heterostructure, in which some or all of the various layers/structures are formed of elements selected from the group III-V materials system. In a still more particular illustrative embodiment, the various layers of the heterostructure 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. The molar fractions given by W, X, Y, and Z can vary between the various layers of the heterostructure 10. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements. Illustrative aspects of the invention are further described in conjunction with ternary AlGaN layers. However, it is understood that these layers are only illustrative of the nitride materials that can be utilized. For example, in other embodiments, one or more of the semiconductor layers can include indium, thereby forming a quaternary AlInGaN layer. To this extent, quantum wells in an active structure described herein can contain indium, e.g., at least one percent indium in a more particular embodiment.

An illustrative embodiment of a group III nitride-based optoelectronic device including the heterostructure 10 can include the active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type contact layer 16 and the electron blocking layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can include sapphire, silicon carbide (SiC), silicon (Si), AlN, GaN, AlGaN, AlON, LiGaO$_2$, or another suitable material. While further details of various layers are primarily described in conjunction with AlGaN materials, it is understood that this material is only illustrative of various materials. To this extent, it is understood that embodiments of such layers also can comprise group III nitride materials including boron, indium, scandium, and/or yttrium. Additionally, other embodiments can include materials other than group III nitride materials, such as other group III-V materials.

The heterostructure 10 can be configured for emission or sensing electromagnetic radiation of a target wavelength. To this extent, the active region 18 can be formed of materials suitable for generating and/or sensing electromagnetic radiation of the target wavelength. Based on the materials utilized in the active region 18, the remainder of the heterostructure 10 can be configured (e.g., optimized) to, for example, reduce optical losses related to absorption as well as internal reflection, and/or the like, which in turn can lead to improved reliability and/or quantum efficiency for the heterostructure 10 and corresponding device, without any increase in the operating voltage.

On an n-type side of the active region 18, the heterostructure 10 can include the substrate 12 and the n-type layer 16 adjacent to the active region 18. Although it is not shown, it is understood that a buffer layer 14 (FIG. 3) may be located between the substrate 12 and the n-type contact layer 16, which can be composed of AlN, an AlGaN/AlN superlattice, and/or the like. The n-type contact layer 16 can be another n-type layer, other than a contact layer, such as a cladding layer, electron supply layer, and/or the like.

On the p-type side of the active region 18, the heterostructure 10 can include a set of p-type layers, such as a p-type layer stack 19 that includes p-type layers 20, 21, 22 according to an embodiment. The p-type layer stack 19 can include an electron blocking layer 20, a p-type interlayer 21, and a p-type contact layer 22.

The electron blocking layer 20 can be located adjacent to the p-type side of the active region 18 (e.g., epitaxially grown thereon). The electron blocking layer 20 can be configured to improve injection efficiency (e.g., a total recombination current relative to the total current in the heterostructure 10) of the heterostructure 10. In an embodiment, a semiconductor alloy composition of the electron blocking layer 20 is at least 15% higher than a semiconductor alloy composition of the quantum well layers in the active region 18. In an embodiment, the thickness of the electron blocking layer 20 is at most 80% of the total thickness $t_p$ of the p-type layer stack 19.

In an embodiment, the aluminum molar fraction of the electron blocking layer 20 is at least equal to or five percent (ten percent in a more particular embodiment) larger than a barrier aluminum molar fraction in the active region 18. To this extent, the aluminum molar fraction of the electron blocking layer 20 can be in a range between 0.2 and 1. In a more particular embodiment, the electron blocking layer 20 comprises a semiconductor layer having a high aluminum content, e.g., an aluminum molar fraction in a range of 0.5 to 0.9, which is designed to block electrons from injection into the p-type layer 22. The electron blocking layer 20 can have a thickness in the range of 5 nanometers to 100 nanometers (10 nanometers to 50 nanometers in a more specific embodiment). In an embodiment, the electron blocking layer 20 can have a p-type doping concentration in the range of 0 to $10^{20}$ dopants per cm$^3$. For example, the p-type dopants can include magnesium (Mg), zinc (Zn), Beryllium (Be), and/or the like. In a specific embodiment, the p-type dopant is Mg. In an alternative embodiment, the electron blocking layer 20 is formed of an $Al_{s1}Ga_{1-s1}N/Al_{s2}Ga_{1-s2}N$ superlattice, where 0.2<s1<0.8 and 0.5<s2<0.9. Each layer of the superlattice can have a thickness in the range of 0.5 nanometers to 5 nanometers, and a p-type doping concentration in the range of $10^{17}$ to $10^{20}$ dopants per cm$^3$.

The p-type layer stack 19 also can include a p-type interlayer 21, which can be epitaxially grown over the electron blocking layer 20. In an embodiment, a semiconductor alloy composition of the p-type interlayer 21 is at least 1% higher than a semiconductor alloy composition of the quantum well layers in the active region 18. In an embodiment, the thickness of the p-type interlayer 21 is at most 80% of the total thickness $t_p$ of the p-type layer stack 19. In a more particular embodiment, the p-type interlayer 21 can have a thickness in a range of 10 nanometers to 500 nanometers. In an embodiment, the p-type interlayer 21 can have a p-type dopant concentration that is at least $1 \times 10^{17}$ cm$^{-3}$. In an embodiment, the p-type dopant can include Mg, Zn, Be, and/or the like. In a more specific embodiment, the p-type dopant is Mg. In a more particular embodiment, the p-type dopant concentration in the p-type interlayer 21 can be in a range of $10^{17}$ to $10^{20}$ dopants per cm$^3$.

In the embodiment, the p-type interlayer 21 can be formed of $Al_pGa_{1-p}N$, where 0≤p≤0.9. The p-type interlayer 21 can have a graded aluminum molar fraction p. For example, the aluminum molar fraction p can vary from the aluminum molar fraction of the electron blocking layer 20 at the heterointerface between the electron blocking layer 20 and the p-type interlayer 21 to an aluminum molar fraction of a p-type contact layer 22 at the heterointerface between the p-type interlayer 21 and the p-type contact layer 22. In a more particular embodiment, the aluminum molar fraction p has a linear grading along a height of the p-type interlayer 21.

Similarly, the p-type interlayer 21 can have a graded doping concentration. For example, the doping concentration can vary from the doping concentration of the electron blocking layer 20 at the heterointerface between the electron blocking layer 20 and the p-type interlayer 21 to $10^{20}$ dopants per cm$^3$ at the heterointerface between the p-type interlayer 21 and the p-type contact layer 22. In a more particular embodiment, the doping concentration has a linear grading along a height of the p-type interlayer 21. Alternatively, the doping concentration and/or aluminum molar fraction p can be adjusted in a series of steps as the p-type interlayer 21 is grown. In another embodiment, the aluminum molar fraction p is graded in a first portion of the p-type interlayer 21 while the doping concentration remains substantially constant, and the doping concentration is graded in a second portion of the p-type interlayer 21 while the aluminum molar fraction p remains substantially constant.

It is understood that the grading of the p-type interlayer 21 is only illustrative. For example, in another embodiment, the p-type interlayer 21 can have a constant composition and/or a constant doping concentration. For example, such a layer can be formed of AlGaN material having an aluminum molar fraction up to 0.6 (0.5 in a more particular embodiment), a thickness in a range of 1 nanometer to 500 nanometers, and a doping concentration in a range of $1 \times 10^{20}$ dopants per cm$^3$ and $1 \times 10^{19}$ dopants per cm$^3$. In an alternative embodiment, the p-type interlayer 21 can be formed of an $Al_{v1}Ga_{1-v1}N/Al_{v2}Ga_{1-v2}N$ superlattice, where 0<v1<0.7 and 0.5<v2<0.9.

The p-type layer stack 19 also can include a p-type contact layer 22 (e.g., a cladding layer, hole supply layer, contact layer, and/or the like), which can be epitaxially grown over the p-type interlayer 21. In an embodiment, a semiconductor alloy composition of the p-type contact layer 22 is at least 1% lower than a semiconductor alloy composition of the p-type interlayer 21. In an embodiment, the thickness of the p-type contact layer 22 is at most 50% of the total thickness $t_p$ of the p-type layer stack 19. In an embodiment, the p-type contact layer 22 can have a p-type dopant concentration that is at least $1 \times 10^{18}$ cm$^{-3}$.

During operation, some of the light generated by the active region 18 travels towards the n-type contact layer 16 and the p-type contact layer 22. As the light travels through the layers, a portion of the light is absorbed thereby causing optical losses in the device. To direct light out of one side of the device, a reflective surface can be placed adjacent to the p-type or n-type sides. Such a surface will reflect the light back into the device and out the other surface. In an embodiment, a reflective surface can be located on both the p-type side and the n-type side after removal of the substrate (e.g., for an edge-emitting device).

In an embodiment, a p-type contact metal stack 24 is formed on the set of p-type layers of the heterostructure 10, e.g., located adjacent to the p-type contact layer 22. The p-contact metal stack 24 can be reflective and formed of a reflective metal material, such as aluminum (Al), rhodium (Rh), and/or the like. The reflective p-type contact metal stack 24 can cause at least 20% of the light that arrives at the interface of the p-type contact metal stack 24 and the p-type contact layer 22 to be reflected back towards the active region 18. This reflected light can be extracted from the device via, for example, emission from the n-type contact layer 16 and/or substrate 12 along with the light emitted by the active region 18 which is directed towards the n-type contact layer 16 when generated. In another embodiment, a contact metal stack can be formed on the set of n-type layers of the heterostructure 10, e.g., located adjacent to the n-type contact layer 16 after removal of the substrate. This n-type contact metal stack can be instead of or in addition to the p-type contact metal stack 24 shown in FIG. 1.

However, the reflected light and the light emitted from the active region 18 towards the n-type layer 16 can result in destructive interference and optical losses in the device. Destructive interference occurs when the reflected light and the emitted light have different phases and cancel one another out, so that the light extracted from the device is significantly reduced or at least less than both the reflected light and the emitted light, individually. The design of the heterostructure 10 is configured to ensure that constructive interference occurs, where the phases of the reflected light and the emitted light are substantially similar or the same, so that when they are combined, the extracted light has a greater amplitude than the reflected light and the emitted light, individually.

As mentioned herein, the active region 18 can be configured to emit a generally monochromatic light at least partially directed towards the n-type contact layer 16 and towards the p-type contact layer 22. The light emitted towards the p-type contact layer 22 is reflected by the p-type contact metal stack 24 back towards the active region 18. The reflected light travels extra distance, called the path length difference, and was reflected, so it will have a phase that is different than the phase of the light emitted towards the n-type contact layer 16.

In order to limit destructive interference, and to promote constructive interference, the phase change due to the reflection should be a multiple of one full period. That is, the phase of the reflected light is $z*360°$, where $z=1, 2, 3, \ldots$, so that the phase of the emitted light and the phase of the reflected light are the same. As a result, the intensities will add together so that the extracted light is larger than the light emitted towards the n-type contact layer. If the phase is 180° off from a multiple of one full period ($z*360°-180°$), where $z=1, 2, 3, \ldots$, the reflected light will be out of phase with the emitted light, and the intensities will cancel each other out, so that the extracted light is less than the light emitted towards the n-type contact layer.

Figure 2:
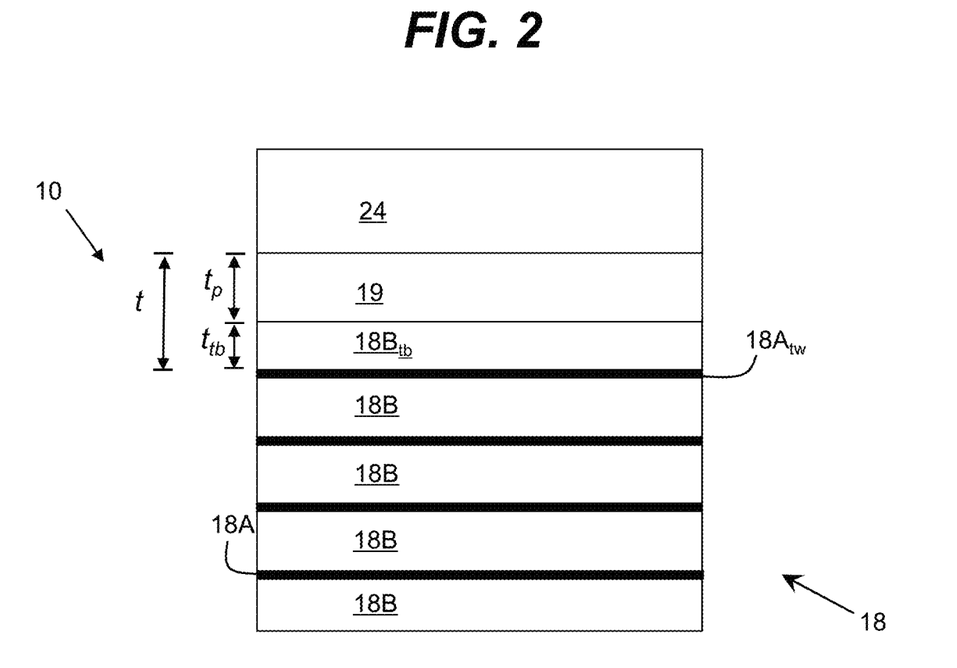
FIG. 2 shows a schematic structure of a heterostructure according to an embodiment.

Turning now to FIG. 2, a portion of the illustrative heterostructure 10 is shown with the active region 18 formed from a series of alternating quantum wells 18A and barriers 18B. The active region 18 includes a topmost quantum well $18A_{tw}$ and a topmost barrier $18B_{tb}$. In an embodiment, the spacing t between the topmost quantum well $18A_{tw}$ and a reflective structure, such as the p-contact metal stack 24, follows the following equation: $t=t_p+t_{tb}$, where $t_p$ is the thickness of the p-type layer stack 19 and $tr_b$ is the thickness of the topmost barrier $18B_{tb}$. However, it is understood that this is only illustrative. For example, an embodiment of an active region can end with a topmost quantum well $18A_{tw}$. In this case, since no barrier is present between the topmost quantum well $18A_{tw}$ and the p-type layer stack 19, a thickness of the topmost barrier is not considered. The spacing t can be designed to ensure constructive interference occurs, where the extracted light corresponds to a combination of the reflected light and the light emitted towards the n-type contact layer 16 (FIG. 1).

When the refractive index of the p-type contact metal stack 24 is lower than the refractive index of the p-type contact layer 22, there is no phase change at the reflection (e.g., a 360° phase shift). The refractive indices are measured at a location immediately adjacent to the interface where reflection occurs. That is, the change in phase $\Phi$ for one round trip through the p-type layer stack 19 follows the following equation: $\Phi=360°*(2n_{eff}*t/\lambda)$, where $\lambda$ is the wavelength of the emitted light, $n_{eff}$ is the effective refractive index of the spacing between the topmost quantum well $18A_{tw}$ and the p-type contact metal stack 24, and t is the thickness of the spacing between the topmost quantum well $18A_{tw}$ and the p-type contact metal stack 24. As light travels through multiple layers with different refractive indices, its phase change in each layer is $360°*(n*t/\lambda)$, where n is the refractive index of the particular layer, t is the thickness of the layer, and $\lambda$ is the wavelength of the light in air. The total phase change is the sum of the phase change for each layer or $360°*\Sigma(n_i*t_i/\lambda)$. Therefore, $n_{eff}=[\Sigma(n_i*t_i)]/t]$. For constructive interference, $2n_{eff}*t/\lambda=x$, where x is an integer (e.g., 1, 2, 3, . . . ) so that there is no phase change. The reflected light will be in the same phase as the emitted light, so that the extracted light is the sum of both. Therefore, the thickness of the spacing between the topmost quantum well $18A_{tw}$ and the p-type contact metal stack 24 should be: $t=(x*\lambda)/2n_{eff}$.

When the refractive index of the p-contact metal stack 24 is higher than the refractive index of the p-type contact layer 22, there is a 180° phase change at the reflection. The refractive indices are measured at a location immediately adjacent to the interface where reflection occurs. In this case, the change in phase $\Phi$ for one round trip through the p-type layer stack 19 follows the following equation: $\Phi=180°+360°*(2n_{eff}*t/\lambda)$. For constructive interference, $2n_{eff}*t/\lambda=y$, where y is a half integer (e.g., 0.5, 1.5, 2.5, . . . ) in order for the reflected light to be in phase with the emitted light.

In an embodiment, a thickness of the barriers 18B and/or quantum wells 18A in the active region 18 can be configured to improve light emission from the heterostructure 10. In general, a thickness of the barriers 18B must be kept sufficiently thin (e.g., ~10 times thinner than the thickness $t_p$ of the p-type layer stack 19) to emit light from the quantum wells 18A. In an embodiment, a thickness of each barrier 18B is no more than ⅕ the thickness $t_p$ of the p-type layer stack 19. In a further embodiment, the combined thickness of one or more pairs of quantum wells and barriers are configured based on the wavelength of the emitted light to provide some constructive interference for light emitted from distinct quantum wells. For example, a distance between the top quantum well $18A_{tw}$ and another well in the active region 18 can be configured to provide constructive interference as described herein.

Figure 3:
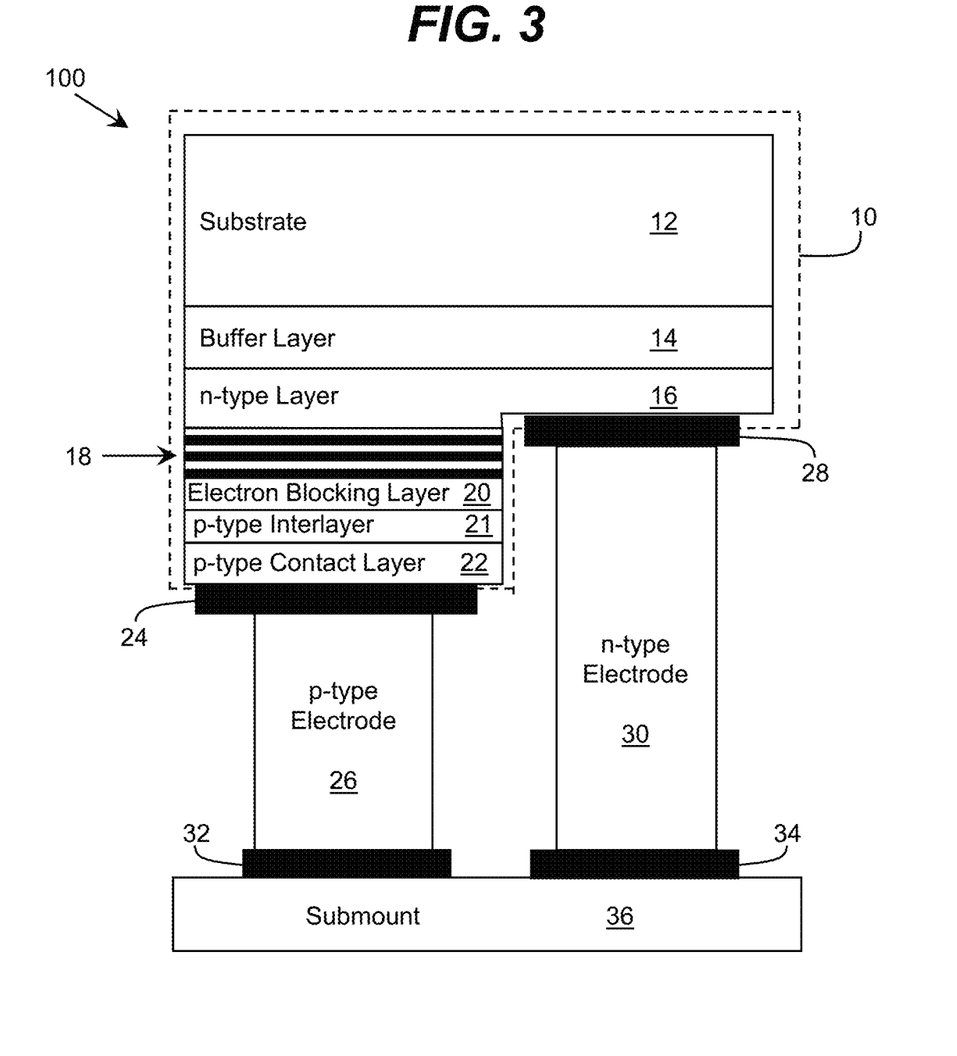
FIG. 3 shows a schematic structure of an illustrative flip chip light emitting diode according to an embodiment.

As described herein, the various heterostructures can be utilized to fabricate any of various types of optoelectronic devices. In an illustrative embodiment, a heterostructure described herein is utilized in fabricating a light emitting diode. In a more particular illustrative embodiment, the light emitting diode has a flip chip arrangement. To this extent, FIG. 3 shows a schematic structure of an illustrative flip chip light emitting diode 100 according to an embodiment. In this case, the diode 100 includes the heterostructure 10 (FIG. 1) on which an electron blocking layer 20, a p-type interlayer 21, and a p-type contact layer 22 (e.g., a cladding layer) are formed. However, it is understood that this structure is only illustrative of the various heterostructures described herein.

As shown with respect to the optoelectronic device 100, a p-type metal contact 24 can be attached to the p-type contact semiconductor layer 22 and a p-type electrode 26 can be attached to the p-type metal contact 24. Similarly, an n-type metal contact 28 can be attached to the n-type contact layer 16 and an n-type electrode 30 can be attached to the n-type metal contact 28. The p-type metal contact 24 and the n-type metal contact 28 can form p-type and n-type ohmic contacts, respectively, to the corresponding layers 22, 16, respectively. It is understood that a contact formed between two layers is considered "ohmic" or "conducting" when an overall resistance of the contact is no larger than the larger of the following two resistances: a contact resistance such that a voltage drop at the contact-semiconductor junction is no larger than two volts; and a contact resistance at least five times smaller than a resistance of a largest resistive element or layer of a device including the contact.

In an embodiment, the p-type metal contact 24 and/or the n-type metal contact 28 can comprise several conductive and reflective metal layers, while the n-type electrode 30 and/or the p-type electrode 26 can comprise highly conductive metal. In an embodiment, the p-type contact semiconductor layer 22 can be transparent (e.g., semi-transparent or transparent) to the electromagnetic radiation generated by the active region 18. For example, the p-type contact semiconductor layer 22 can comprise a short period superlattice lattice structure, such as a transparent magnesium (Mg)-doped AlGaN/AlGaN short period superlattice structure (SPSL). Furthermore, the p-type electrode 26 and/or the n-type electrode 30 can be reflective of the electromagnetic radiation generated by the active region 18. In another embodiment, the n-type contact layer 16 and/or the n-type electrode 30 can be formed of a short period superlattice, such as an AlGaN SPSL, which is transparent to the electromagnetic radiation generated by the active region 18.

As further shown with respect to the optoelectronic device 100, the device 100 can be mounted to a submount 36 via the electrodes 26, 30 in a flip chip configuration. In this case, the substrate 12 is located on the top of the optoelectronic device 100. To this extent, the p-type electrode 26 and the n-type electrode 30 can both be attached to a submount 36 via contact pads 32, 34, respectively. The submount 36 can be formed of aluminum nitride (AlN), silicon carbide (SiC), and/or the like.

Any of the various layers of the device 100 can comprise a substantially uniform composition or a graded composition. For example, a layer can comprise a graded composition at a heterointerface with another layer. In an embodiment, the p-type semiconductor layer 20 comprises a p-type electron blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the semiconductor heterostructure 10 of the optoelectronic device 100 described herein is only illustrative. To this extent, the semiconductor heterostructure 10 can include an alternative layer configuration, one or more additional layers, and/or the like. As a result, while the various layers are shown immediately adjacent to one another (e.g., contacting one another), it is understood that one or more intermediate layers can be present in the semiconductor heterostructure 10. For example, an illustrative semiconductor heterostructure 10 can include an undoped layer between the active region 18 and one or both of the p-type contact semiconductor layer 22 and the n-type contact semiconductor layer 16 (e.g., an electron supply layer). In an embodiment, some or all of the substrate 12 and/or buffer layer 14 can be removed after fabrication of the heterostructure 10. In an embodiment, an emission surface of the device 100 (e.g., the external facing surface of the device 100) can be configured to reduce total internal reflection. For example, the surface can be patterned or roughened to reduce total internal reflection at the surface.

While aspects of the invention are shown and described in conjunction with a reflective p-type metal contact 24, it is understood that embodiments can include any type of reflective structure, which can be located on either the n-type or p-type side of the active region 18. For example, an embodiment of the semiconductor heterostructure 10 can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type contact semiconductor layer 22 and the active region 18. Similarly, the semiconductor heterostructure 10 can include a p-type layer 20 located between the p-type contact semiconductor layer 22 and the active region 18. The DBR structure and/or the p-type layer 20 can comprise any composition based on a desired wavelength of the light generated by the device/heterostructure. In one embodiment, the DBR structure comprises a Mg, Mn, Be, or Mg+Si-doped p-type composition. The p-type layer 20 can comprise a p-type AlGaN, AlInGaN, and/or the like. It is understood that the semiconductor heterostructure 10 can include both the DBR structure and the p-type layer 20 (which can be located between the DBR structure and the p-type contact layer 22) or can include only one of the DBR structure or the p-type layer 20. In an embodiment, the p-type layer 20 can be included in the device/heterostructure in place of an electron blocking layer. In another embodiment, the p-type layer 20 can be included between the second p-type contact layer 22 and the electron blocking layer.

Regardless, when included, a distance between the active region 18 and the DBR structure can be configured to ensure that constructive interference occurs between light emitted from the active region 18 and light reflected from the DBR structure as described herein. Depending on a design of the DBR structure, the distance can be determined based on the higher or lower refractive index as described herein. In this case, the p-type contact 24 can be any type of contact, and need not be reflective.

Figure 4:
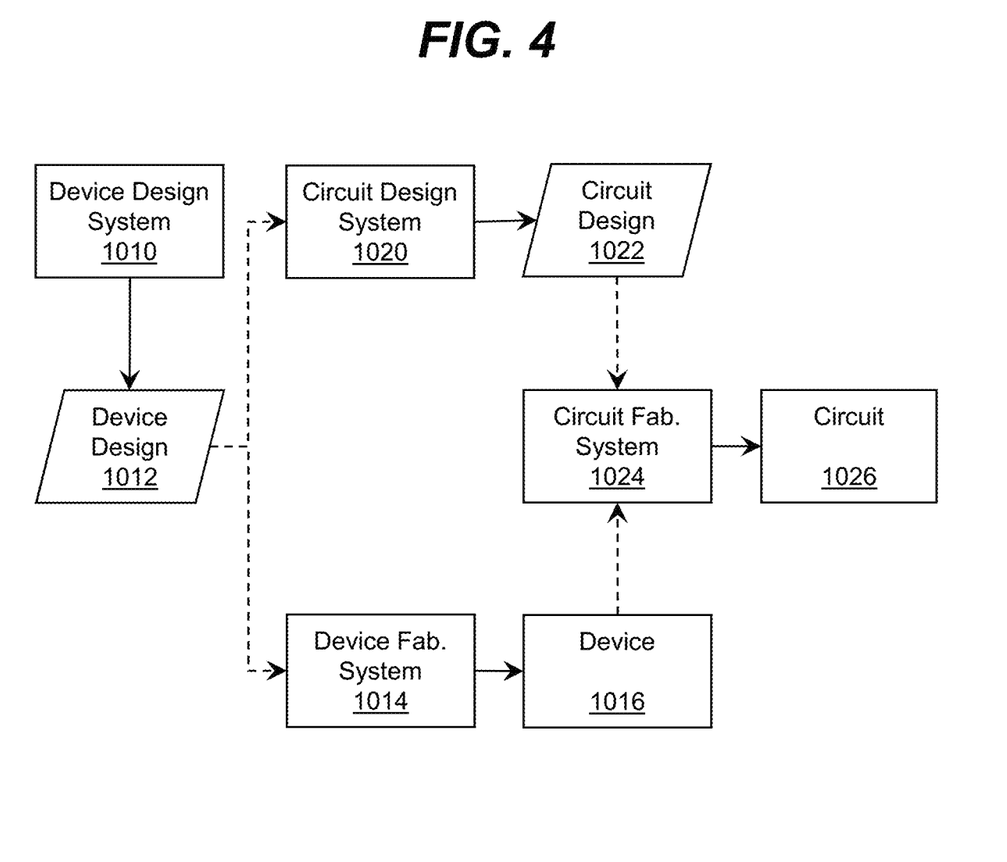
FIG. 4 shows an illustrative flow diagram for fabricating a circuit according to an embodiment.

In one embodiment, the invention provides a method of designing and/or fabricating a circuit that includes one or more devices designed and fabricated as described herein. To this extent, FIG. 4 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A heterostructure comprising:
   a set of n-type layers;
   an active region located adjacent to the set of n-type layers, wherein the active region includes at least one quantum well configured to generate radiation at a peak emitted wavelength;
   a set of p-type layers located adjacent to the active region, wherein the set of p-type layers are transparent to radiation generated in the active region; and
   a reflective structure located adjacent to the set of p-type layers, wherein a thickness of a spacing between the at least one quantum well and the reflective structure is such that radiation having the peak emitted wavelength reflected from the reflective structure and radiation having the peak emitted wavelength emitted from the at least one quantum well of the active region in a direction toward the set of n-type layers constructively combine.

2. The heterostructure of claim 1, wherein the set of p-type layers comprises a p-type layer stack comprising:
   an electron blocking layer;
   a p-type interlayer located adjacent to the electron blocking layer; and
   a p-type contact layer located adjacent to the p-type interlayer.

3. The heterostructure of claim 2, wherein a thickness of the electron blocking layer is at most 80% of the thickness of the p-type layer stack.

4. The heterostructure of claim 2, wherein band gap of the electron blocking layer is at least 10% larger than a band gap of a quantum well in the active region.

5. The heterostructure of claim 2, wherein a thickness of the p-type interlayer is at most 80% of the thickness of the p-type layer stack.

6. The heterostructure of claim 2, wherein a band gap of the p-type interlayer is at least 1% larger than a band gap of a quantum well in the active region.

7. The heterostructure of claim 2, wherein a p-type dopant concentration of the p-type interlayer is at least $1\times10^{17}$ cm$^{-3}$.

8. The heterostructure of claim 1, wherein the reflective structure is a Distributive Bragg Reflector structure located adjacent to the set of p-type layers.

9. The heterostructure of claim 2, wherein a thickness of the p-type contact layer is at most 50% of the thickness of the p-type layer stack.

10. The heterostructure of claim 2, wherein a band cap of the p-type contact layer is at least 1% smaller than a band gap of the p-type interlayer.

11. The heterostructure of claim 1, wherein a refractive index of the reflective structure is lower than a refractive index of a p-type layer in the set of p-type layers located immediately adjacent to the p-type contact, and wherein a thickness of a spacing between a topmost quantum well in the active region and the reflective structure is approximately equal to an integer multiple of the emitted wavelength divided by two times an effective refractive index of the spacing.

12. The heterostructure of claim 1, wherein a refractive index of the reflective structure is higher than a refractive index of a p-type layer in the set of p-type layers located immediately adjacent to the p-type contact, and wherein a thickness of a spacing between a topmost quantum well in the active region and the reflective structure is approximately equal to a half integer multiple of the emitted wavelength divided by two times an effective refractive index of the spacing.

13. The heterostructure of claim 1, further comprising a second reflective structure located adjacent to the set of n-type layers, wherein a thickness of the set of n-type layers is configured to promote constructive interference between radiation having the peak emitted wavelength reflected from the reflective structure and radiation having the peak emitted wavelength emitted from the active region in a direction toward the set of p-type layers.

14. A heterostructure comprising:
a set of n-type layers;
an active region located adjacent to the set of n-type layers, the active region including a plurality of quantum wells alternating with a plurality of barriers, wherein the active region is configured to generate radiation at a peak emitted wavelength;
a set of p-type layers located adjacent to the active region, wherein the set of p-type layers are transparent to radiation generated in the active region, and wherein the set of p-type layers comprises:
an electron blocking layer;
a p-type interlayer located adjacent to the electron blocking layer; and
a p-type contact layer located adjacent to the p-type interlayer; and
a reflective structure located adjacent to the set of p-type layers, wherein a refractive index of the reflective structure is lower than a refractive index of a p-type layer in the set of p-type layers located immediately adjacent to the reflective structure, and wherein a thickness of a spacing between the at least one quantum well in the active region and the reflective structure is approximately equal to an integer multiple of the emitted wavelength divided by two times an effective refractive index of the spacing.

15. The heterostructure of claim 14, wherein the at least one quantum well includes a quantum well of the plurality of quantum wells located closest to the set of p-type layers.

16. The heterostructure of claim 14, wherein the reflective structure is a Distributive Bragg Reflector structure located adjacent to the set of p-type layers.

17. An optoelectronic device comprising:
a heterostructure including:
a first set of semiconductor layers;
an active region located adjacent to the first set of semiconductor layers, the active region including a plurality of quantum wells alternating with a plurality of barriers, wherein the active region is configured to generate radiation at a peak emitted wavelength;
a second set of semiconductor layers located adjacent to the active region, wherein the second set of semiconductor layers are transparent to radiation generated in the active region; and
a reflective structure located adjacent to the second set of semiconductor layers, wherein a thickness of a spacing between a quantum well of the plurality of quantum wells located closest to the second set of semiconductor layers and the reflective structure is such that radiation having the peak emitted wavelength reflected from the reflective structure and radiation having the peak emitted wavelength emitted from the quantum well in a direction toward the first set of semiconductor layers constructively combine.

18. The device of claim 17, wherein a refractive index of the reflective structure is lower than a refractive index of a semiconductor layer of the second set of semiconductor layers located immediately adjacent to the reflective structure, and wherein the thickness of the spacing between the quantum well and the reflective structure is approximately equal to an integer multiple of the emitted wavelength divided by two times an effective refractive index of the spacing.

19. The device of claim 17, wherein a refractive index of the reflective structure is higher than a refractive index of a semiconductor layer of the second set of semiconductor layers located immediately adjacent to the reflective structure, and wherein the thickness of the spacing between the quantum well and the reflective structure is approximately equal to a half integer multiple of the emitted wavelength divided by two times an effective refractive index of the spacing.

20. The device of claim 17, wherein the reflective structure is a Distributive Bragg Reflector structure located adjacent to the second set of semiconductor layers.

* * * * *

UNITED STATES PATENT AND TRADEMARK OFFICE
CERTIFICATE OF CORRECTION

PATENT NO. : 11,784,280 B2
APPLICATION NO. : 17/206398
DATED : October 10, 2023
INVENTOR(S) : Joseph Dion et al.

It is certified that error appears in the above-identified patent and that said Letters Patent is hereby corrected as shown below:

In the Specification

Column 6, Line 11, "AIBN" should read "AlBN".

Column 10, Line 12, "A" should read "$\cong$".

In the Claims

Column 14, Line 51, Claim 10, "band cap" should read "band gap".

Signed and Sealed this
Second Day of January, 2024

*Katherine Kelly Vidal*
Katherine Kelly Vidal
*Director of the United States Patent and Trademark Office*